US 6,714,887 B1

(12) United States Patent
Wong et al.

(10) Patent No.: US 6,714,887 B1
(45) Date of Patent: Mar. 30, 2004

(54) PORTABLE DISC DRIVE TESTING APPARATUS

(75) Inventors: David Swee Hoon Wong, Singapore (SG); Chin Ker New, Singapore (SG); Chee Kong Tan, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/401,107

(22) Filed: Sep. 22, 1999

Related U.S. Application Data

(60) Provisional application No. 60/102,300, filed on Sep. 29, 1998.

(51) Int. Cl.[7] .................................................. G06F 11/00
(52) U.S. Cl. .......................... 702/115; 702/57; 702/62; 702/80; 702/120; 702/122; 702/182
(58) Field of Search ............................... 702/57, 58, 59, 702/60, 62, 64, 80, 79, 108, 117, 119, 120, 122, 123, 124, 182–186, 188, 189, FOR 103, FOR 104, FOR 134, FOR 135, FOR 170, FOR 171

(56) References Cited

U.S. PATENT DOCUMENTS

| | | | | |
|---|---|---|---|---|
| 4,108,358 A | * | 8/1978 | Niemaszyk et al. ........ 235/302 |
| 4,141,066 A | * | 2/1979 | Keiles ......................... 364/119 |
| 4,348,761 A | * | 9/1982 | Berger .......................... 371/21 |
| 4,489,414 A | * | 12/1984 | Titherley ..................... 371/20 |
| 4,641,207 A | * | 2/1987 | Green et al. .................. 360/55 |
| 4,675,537 A | * | 6/1987 | Mione ......................... 307/38 |
| 4,725,968 A | * | 2/1988 | Baldwin et al. ............ 364/550 |
| 4,794,599 A | * | 12/1988 | Purcell et al. .............. 714/719 |
| 5,214,762 A | * | 5/1993 | Bush et al. .................. 395/275 |
| 5,361,346 A | * | 11/1994 | Panesar et al. ............. 395/575 |
| 5,519,882 A | * | 5/1996 | Asano et al. ............... 395/830 |
| 5,644,705 A | * | 7/1997 | Stanley .................... 395/183.18 |
| 5,893,048 A | * | 4/1999 | Pate et al. ..................... 702/56 |
| 5,991,805 A | * | 11/1999 | Krukovsky .................. 709/223 |

FOREIGN PATENT DOCUMENTS

| | | | |
|---|---|---|---|
| DE | 10048402 A1 | * | 9/1999 |
| JP | 05189865 A | * | 7/1993 |
| JP | 07045935 | * | 2/1995 |

\* cited by examiner

*Primary Examiner*—Marc S. Hoff
*Assistant Examiner*—Carol S. W. Tsai
(74) *Attorney, Agent, or Firm*—Mitchell K. McCarthy

(57) ABSTRACT

The present invention relates to an improved method and apparatus for testing disc drives. In one embodiment of the present invention, the apparatus includes a microprocessor capable of storing at least one test program. Data transfer between the microprocessor and the disc drive under test is provided for in the form of an interface, such that the interface is compatible for connection to the disc drive under test.

8 Claims, 2 Drawing Sheets

PORTABLE DISC DRIVE TESTING APPARATUS

This application claims priority from U.S. Provisional Application No. 60/102,300, filed Sep. 29, 1998.

FIELD OF INVENTION

The present invention relates generally to disc drives. More particularly, the present invention relates to a portable disc drive testing apparatus.

BACKGROUND OF THE INVENTION

One common way of testing a disc drive is to connect the disc drive to a personal computer and run a commercial software program to identify faults in the disc drive. Alternatively, special test equipment is available from the market for conducting a wide range of tests on disc drives.

It is felt that the personal computer is under-utilized when dedicated to running tests on disc drives suspected of being faulty. On the other hand, the special test equipment currently available from the market is expensive. It is therefore desirable to seek a relatively cheaper means of testing disc drives.

Furthermore, it is also desirable that the equipment should allow for the detection of fault related to the drive interface. Unfortunately, this aspect of testing is often not possible when the disc drive is required to operate via a serial port under test conditions, instead of through the drive interface.

In addition, it is felt that there is a need for test equipment to be portable, as the test equipment available is too bulky. Very often, the efficiency of the testing process can be significantly improved if the test equipment is small and light enough for the operator to carry it around. Preferably, the test equipment should be easy to operate and not require much training of the operator.

The present invention provides a solution to the above problems, and offers other advantages over the prior art.

SUMMARY OF THE INVENTION

The present invention relates to an improved apparatus for testing disc drives.

In one embodiment of the present invention, the apparatus includes a microprocessor capable of storing at least one test program. Data transfer between the microprocessor and the disc drive under test is provided for in the form of an interface, such that the interface is compatible for connection to the disc drive under test.

In one aspect of the invention, the interface is compatible for connection to the drive interface of the disc drive under test. This feature offers advantages in that it allows for the detection of faults related to the drive interface.

In another aspect of the invention, the apparatus includes a power control mechanism which controls the power supply to the apparatus. In one embodiment, the power control mechanism may be so constructed as to relay the power supply to disc drive such that the disc drive is powered by the same power supply to the apparatus. To the operator, the testing procedure is made more convenient as only one power supply is required. More importantly, this feature provides the apparatus with the capability of performing contact-start-stop tests, as well as other tests, without the need for the operator to be well-versed in programming, unlike the test equipment available in the market.

DETAILED DESCRIPTION

Figure 1:
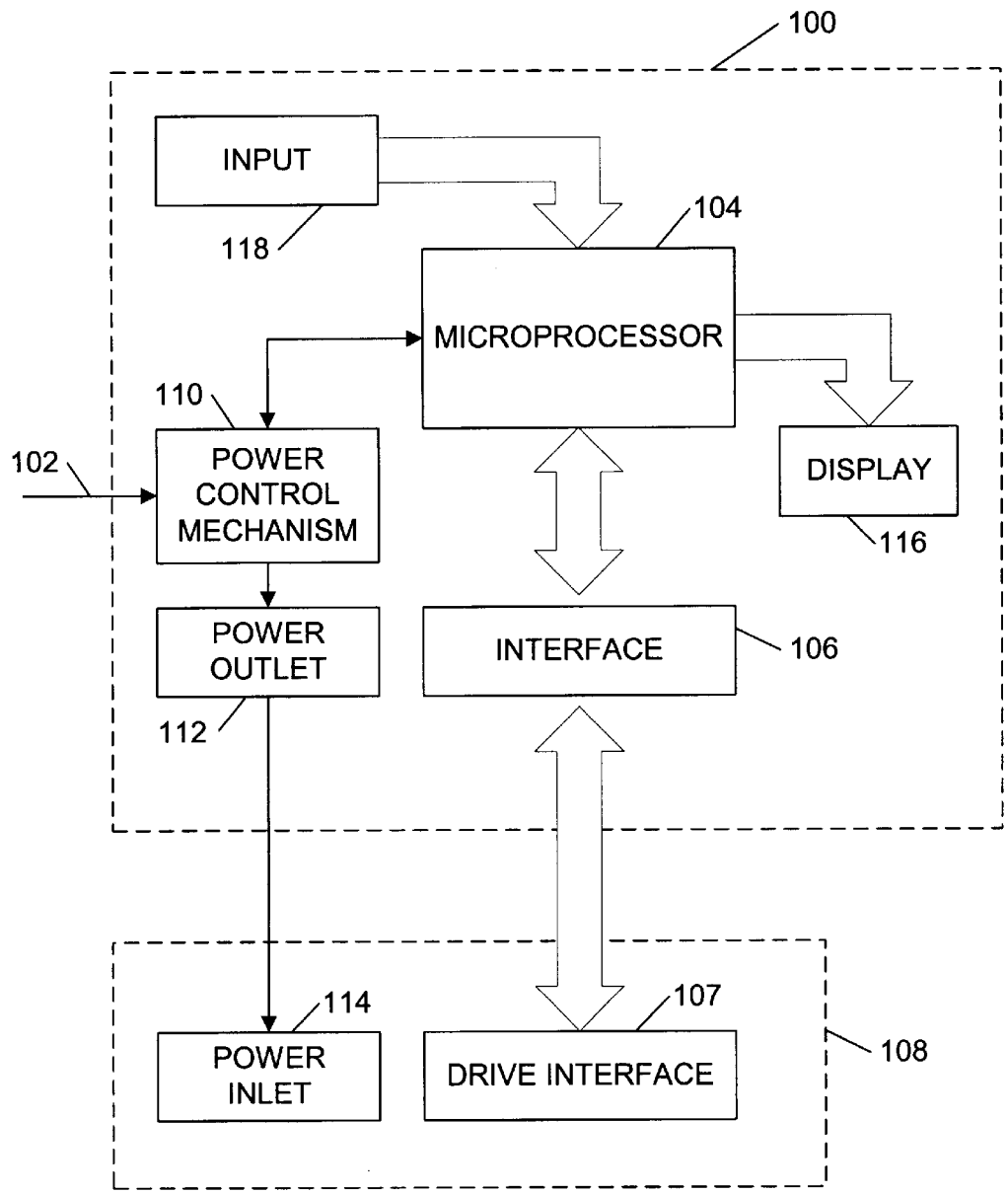
FIG. 1 is a block diagram of a preferred embodiment of the apparatus in connection with a disc drive under test.

An apparatus 100 according to most preferred embodiment of the present invention is shown in FIG. 1. The apparatus 100 includes a microprocessor 104, a memory within the microprocessor 104 for storing one or more test program, an interface 106 connected to the microprocessor 104 and a power control mechanism 110. The interface 106 serves to communicate between the microprocessor 104 and the disc drive 108 under test and the power control mechanism 110 serves to control the power supply 102 to the apparatus 100.

The interface 106 provides for operative coupling between the apparatus 100 and a drive interface 107 of the disc drive 108 such that the disc drive 108 can be operated through the drive interface 107 under test conditions.

This coupling can be direct, or if so desired, an interface cable can be provided to connect from the interface 106 to the drive interface 107. Use of the interface cable is sometimes preferred so as to minimize wear and tear on the drive interface. However the interface is so constructed that the apparatus can be directly coupled to the disc drive, for example, in situations where a suitable cable is not available. This feature adds to the flexibility of the apparatus and contributes towards making the procedure of testing disc drives as convenient as possible to the operator.

The power control mechanism 110 may be a switch to control the power supply to the apparatus 100. In a preferred embodiment, the power control mechanism 110 includes a relay such that electricity can be diverted or relayed from the apparatus 100 to the disc drive 108 via a power outlet 112. In particular, it is desired that the power outlet 112 is connectable to a power inlet 114 of the disc drive such that when the power control mechanism 110 is switched on, the apparatus 100 and the disc drive 108 are simultaneously operated by the same power supply. This allows the contact-start-stop tests to be performed on the disc drive, and is an advantage over some of the prior art test equipment which requires the disc drive to be separately powered from the testing equipment.

In addition, the apparatus 100 may include an input device 118 for the operator to select one or more test programs from the memory for testing the disc drive 108. Where desirable, the input device 118 and the microprocessor 104 can be so programmed such that the selected test program or test programs are executed as soon as the operator switches on the apparatus 100.

Figure 2:
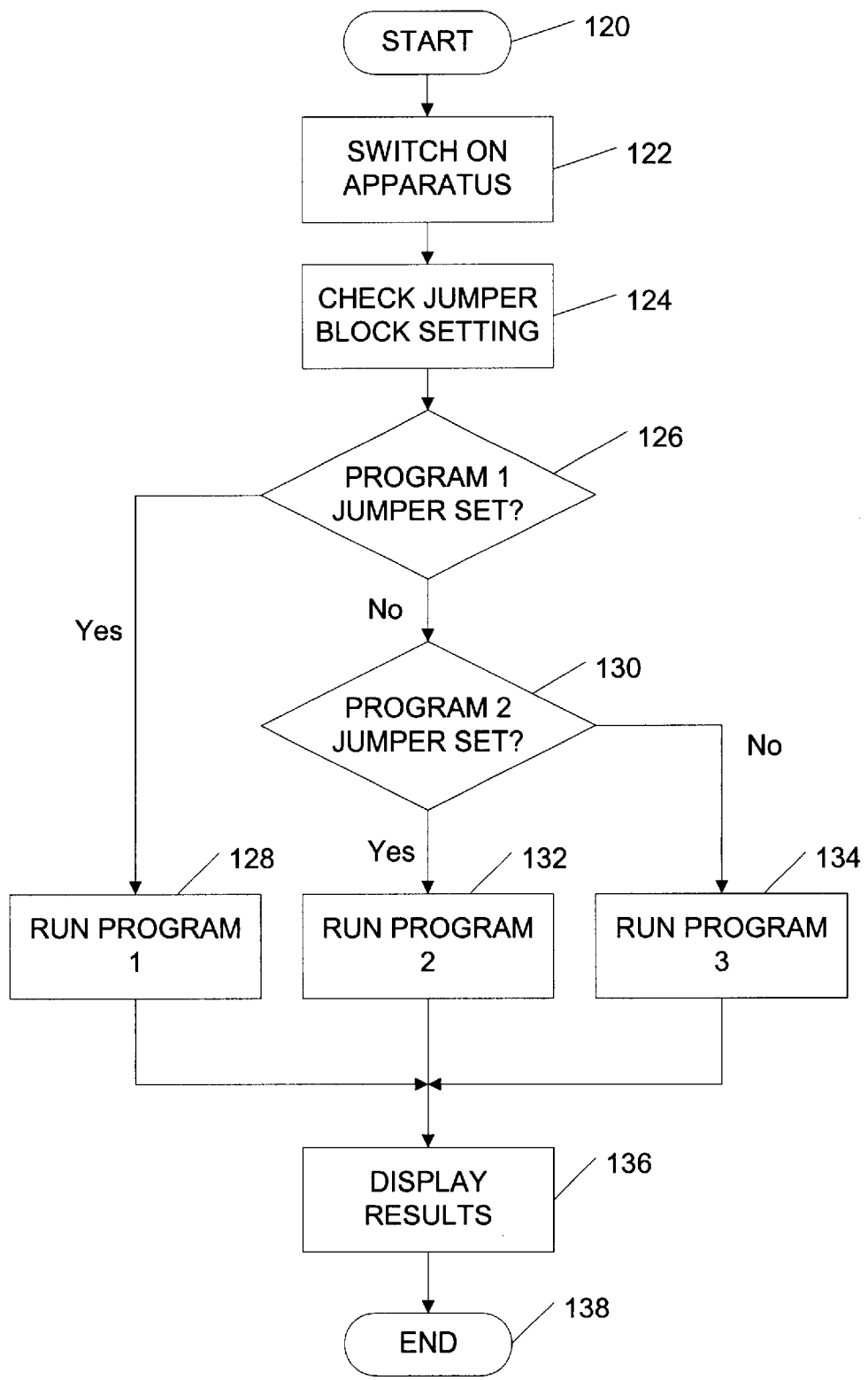
FIG. 2 is a flowchart showing a method in which one embodiment of the input device allows for the selection of different test programs.

FIG. 2 illustrates an example where the memory stores more than one test program, and the input device 118 is provided in the form of a jumper block. The process is initiated at 120. The operator switches on the apparatus in the step 122 and causes the program to check the jumper block setting 124. At step 126, the program checks if the jumper is set to execute test program 1. If it is, test program 1 is executed 128. Otherwise, the program goes on to check if the jumper is set to execute the next test program stored in the memory 130. If the program finds that the jumper block setting is put to test program 2 and it will execute test program 2, otherwise it will execute the next test program stored in the memory 134. The test results can be stored in the disc drive itself, or in this example, it can be shown on the display 136 and the test procedure ends 138. This example illustrates the situation where only three test programs are stored in the memory, however, a person skilled in the art will understand that it can be easily extended to the situation where more than three test programs are stored in the memory.

Thus, in general, the apparatus can be designed such that the operator uses the jumper block to set one of the test programs as a default test program. Once the operator switches on the apparatus 100, the default test program is executed and the test is conducted on the disc drive 108.

To keep the apparatus 100 cheap to manufacture and physically compact enough for it to be palm-sized, a jumper switch or a jumper block is preferred. It is to be understood, however, that the invention is not thus limited in this aspect, as the input device 118 can be in the form of a keypad, switches or other devices without going beyond the scope of the present invention.

The apparatus 100 further includes a display 116 connected to the microprocessor 104 for displaying information, e.g., test results, status of test, type of test selected. In the preferred embodiment, the display is an LED (light emitting diode) display unit. This is to keep the cost of manufacturing the apparatus low, as well as to keep the size of the apparatus small. In the preferred embodiment, the apparatus 100 as a whole is not bigger than the size of human palm, and can be easily carried about by the operator in one hand. This greatly adds to the efficiency and convenience of the testing procedure.

In one example, which is given solely for illustrative purposes, the display 116 is a LED display unit which will display a code identifying the test program which has been selected as the default test program. The microprocessor 104 can be programmed such that the test results are indicated by the LED display unit. In addition, the microprocessor 104 can be programmed to write a back-up copy of the test results to the disc drive.

The invention therefore provides for an apparatus dedicated to the testing of disc drive, with the advantages of being cheap to manufacture and small enough for the operator to carry on his rounds of testing. Furthermore, use of the apparatus does not require extensive training of the operator. Once the test programs are installed in the apparatus, the operator may not need to do much except connect the apparatus to the disc drive and switch on the power control mechanism.

Nevertheless, the apparatus allows for a great variety of tests to be conducted. Examples of some of the test programs are listed included in the present specification for a better understanding of the workings of the apparatus, but are not intended to limit the scope of the invention to such. The apparatus can be programmed to run any test sequence that is not specified below, including most of the commands that were specified in the AT Attachment (ATA) specification.

Examples of test programs are listed in Table 1 below to better illustrate the workings of the apparatus 100, and should not be taken to be the only test programs which can be executed by the apparatus 100.

Table 1 shows a Customer Failure Verification Test (Read Only) which can be easily conducted using the apparatus 100 for checking the disc drive 108 for errors. If the disc drive 108 fails during testing, the apparatus I 00 will stop the test, switch off the disc drive and display the error messages.

TABLE 1

1. Switch on the power supply to the disc drive 108.
2. Check the configuration of the disc drive 108 to determine if it is in a Master, Slave, or Cable Select Mode.
3. Perform an 'Identify' command to obtain the 'total number of addressable sectors' from the disc drive 108.
4. Perform Read Verify from LBA 0 to last LBA (Logical Block Address).
5. Perform 5000 random Read Verify.
6. Switch off the disc drive and display the status of the test.

Table 2 shows a Customer Failure Verification Test which involves performing write and read operations on the entire disc drive 108 and provides for the recovery of sectors which were badly written. If more than 20 errors were encountered during testing, the apparatus will stop the test, switch off the disc drive and display the error messages on the display unit.

TABLE 2

1. Switch on the power supply to the disc drive 108.
2. Check the disc drive 108 configuration (Master, Slave, or Cable Select Mode).
3. Perform an 'Identify' command to obtain the 'total number of addressable sectors' from the disc drive 108.
4. Perform Write & Read Verify from LBA 0 to LBA 30,208 (≈15 Mbytes) using 5 different data patterns.
5. Perform Read Verify from LBA 0 to last LBA. If an error is encountered, the apparatus 100 will perform 5 times of Write & Read Verify on the fail location using the same 5 different data patterns.
6. Perform Read Verify from LBA 0 to last LBA. (If no error is encountered during step 5, step 6 will be ignored.)
7. Perform 5000 random Read Verify.
8. Switch off the disc drive 108 and display the status of the test.

One method of performing a contact-start-stop test is to use a test program similar to the Dummy Contact-Start-Stop Test shown in Table 3. This test is sometimes used in the initial design of a disc drive 108. The test results can be stored in the memory of the apparatus 100 instead of in the disc drive 108 as the latter may not be able to perform the read and write operations. The test program as shown below will run until the operator switches off the apparatus 100. The On and Off timing need not be 30 seconds.

TABLE 3

1. Switch On the power supply to the disc drive 108.
2. Update the test counter and do nothing for 30 seconds.
3. After the 30 seconds are up, switch Off the disc drive 108 and display the test status.
4. Do nothing for 30 seconds.
5. Repeat steps 1 to 4.

Test program 4 shows another example of a Contact-Start-Stop Test. In this case, the apparatus 100 performs a routine check for errors on the entire disc drive on every 1000 cycle and stores the test results in the disc drive 108. If the disc drive 108 fails during testing, the apparatus 100 will stop the test, switch off the disc drive 108 and display the error messages. The test result file of a test can be stored in the disc drive 108. To retrieve this information, the apparatus 100 performs a read operation to the disc drive 108. The test results may include the test status (e.g., Pass, Fail, number of hours tested so far and number of contact-start-stop count) and failure status (e.g., the location failed, the error code, status code, and other detail failure code).

TABLE 4

1. Switch on the power supply to the disc drive 108.
2. Check the disc drive 108 configuration (Master, Slave, or Cable Select Mode).
3. Execute disc drive diagnostic command.
4. Perform an 'Identify' command to obtain the 'total number of addressable sectors' from the disc drive 108.
5. Read the test results from the disc drive 108. If it is a new run or the test was stopped during the last run but the disc drive 108 did not fail, go to step 6 and carry on the test. If the results indicate that the disc drive failed during the last run, the apparatus 100 will switch off the disc drive 108 and display the error message.
6. Update test counter. At this stage, there are two possibilities:
   (a) If the test counter reach 100 cycles, performed Read Verify on 65535 sectors on both ID (inner diameter) and OD (outer diameter) locations; or
   (b) If the test counter reach 1000 cycles, performed Read Verify from LBA 0 to last LBA.
7. Write the test results to the disc drive 108 and do nothing for 30 seconds.
8. Upon 30 seconds expired, switch Off the disc drive 108 and display the test status.
9. Do nothing for 30 seconds.
10. Once 30 seconds reached, Repeat steps 1 to 9.

The apparatus 100 can also be used to conduct a reliability test on the disc drive 108, as in a Full Stroke Seek Test shown in Table 5 below where the apparatus seeks the drive from LBA 0 to last LBA. This test will run until the operator switches off the apparatus 100.

TABLE 5

1. Switch On the power supply to the disc drive 108.
2. Execute disc drive diagnostic command.
3. Perform an 'Identify' command to obtain the 'total number of addressable sectors' from the disc drive 108.
4. Read the test results from the disc drive 108. Continue step 5 if it is a new run or the disc drive 108 was stopped during the last run but had not failed. Stop testing and display error message on the display unit if the previous run failed.
5. Perform Seek operation from LBA 0 to Last LBA.
6. On every hour, update the test time.
7. Repeat steps 5 and 6.

Table 6 shows a Fly Stiction Test for checking the disc drive 108 for stiction.

TABLE 6

1. Switch On the power supply to the disc drive 108.
2. Execute disc drive diagnostic command.
3. Perform an 'Identify' command to obtain the 'total number of addressable sectors' from the disc drive 108.
4. Read the test results from the disc drive 108. Continue with step 5 if it is a new run or if the disc drive 108 was stopped during the last run but had not failed. Stop testing and display error message if the previous run failed.
5. Perform Random Write and Read operations from LBA 0 to Last LBA and in the reverse direction.
6. On every hour, update the test time. When reached 23 hours, stop the random Write and Read test and dwell (i.e. stay at the last location and do nothing) for 1 hour.
7. Repeat steps 4 and 6 for 30 days.
8. Switch Off the disc drive 108.

The functionality of the disc drive 108 can be verified by running a Read/Write Test similar to that shown in Table 7 where the read and write operations are performed on the entire disc drive 108. If the disc drive 108 fails during testing, the apparatus will stop the test, switch off the disc drive 108 and display the error messages.

TABLE 7

1. Switch On the power supply to the disc drive 108.
2. Execute disc drive diagnostic command.
3. Perform an 'Identify' command to obtain the 'total number of addressable sectors' from the disc drive 108.
4. Perform Sequential Read operations from LBA 0 to Last LBA.
5. Perform Sequential Read operation from last LBA to LBA 0.
6. Perform Sequential Write/Read from LBA 0 to last LBA.
7. Perform 20,000 times of Random Write/Read/Compare.
8. Switch Off the disc drive 108.

Table 8 shows a RDT Test which can be used to test the reliability of a disc drive 108. The apparatus 100 will update the test time counter on every hour. If the disc drive fails during testing, the apparatus will stop the test, switch off the disc drive 108 and display the error messages.

TABLE 8

1. Switch On the power supply to the disc drive 108.
2. Execute disc drive diagnostic command.
3. Perform an 'Identify' command to obtain the 'total number of addressable sectors' from the disc drive 108.
4. Read the test results from the disc drive 108. Continue with step 5 if it is a new run or the disc drive 108 was stopped during the last run but not failed. Stop testing and display error message on the display unit if the previous run failed.
5. Perform Sequential Read operations.
6. Perform Sequential Write/Read from LBA 0 to last LBA.
7. Perform Sequential Write/Read from last LBA to LBA 0.
8. Perform 20,000 Random Write/Read.
9. Perform Sequential Read operation from LBA 0 to last LBA.
10. Perform 20,000 Random Write/Read/Compare from LBA 0 to last LBA.
11. Perform Sequential Read operation from LBA 0 to last LBA.
12. Perform 20,000 Random Read Operation.
13. Perform 100 times of random delay Write operation. Note delay timing range from 1 seconds to 1 minute.
14. Perform Sequential Read operations.
15. Switch off the disc drive 108 for 30 minutes.
16. Repeat steps 1 to 15 for 30 days.

The Write Read Compare Test shown in Table 9 is another example of a test which checks the functionality of a disc drive 108. A comparison operation is performed to ensure the integrity of the disc drive 108. This test will continue to run until the operator switches off the apparatus 100. The apparatus 100 will update the test time counter on every hour. If the disc drive 108 fails during testing, the apparatus 100 will stop the test, switch off the disc drive 108 and display the error messages.

TABLE 9

1. Switch On the power supply to the disc drive 108.
2. Execute disc drive diagnostic command.
3. Perform an 'Identify' command to obtain the disc drive geometry (such as number of Cylinder, Head and Sector) information from the disc drive 108.
4. Read the test results from the disc drive 108. Continue with step 5 if it is a new run or the disc drive 108 was stopped during the last run but not failed. Stop testing and display error message on the display unit if the previous run failed.
5. Perform Sequential Read operations from Cylinder 0 to last Cylinder.
6. Perform Sequential Write/Read operations from Cylinder 0 to last Cylinder.
7. Perform Sequential Write/Read operations from last Cylinder to Cylinder 0.
8. Perform Random Write/Read/Compare operations.
9. Perform Sequential Read operations from Cylinder 0 to last Cylinder.
10. Perform Random Read operation from Cylinder 0 to last Cylinder.
11. Switch off the disc drive 108 for 15 minutes.
12. Repeat steps 1 to 11.

To measure how long a disc drive takes to get ready, the apparatus 100 can be programmed to run a test similar to the Drive Start Time Test shown in Table 10.

TABLE 10

1. Set the Start time timer to 0.
2. Switch On the power supply to the DUT and start the Start time timer.
3. Check the disc drive Ready bit. If it is set, stop the start time timer.
4. Switch Off the disc drive and display the startup timing of the disc drive.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the microprocessor 104 may act as the relay without the need for a separate component.

In addition, although the preferred embodiment described herein is directed to an apparatus for testing disc drives, it will be understood by those skilled in the art that the teachings of the present invention can be applied to other test situations without departing from the scope and spirit of the present invention.

What is claimed is:

1. A self-contained portable apparatus for testing a disc drive, the apparatus comprising:

a microprocessor having a memory for storing a plurality of test programs;

an input device connected to the microprocessor, the microprocessor automatically responsive only to a preselected input setting of the input device in executing one of the plurality of test programs;

an interface operatively coupled to the microprocessor, the interface being configured for communication between the microprocessor and the disc drive;

a power control mechanism configured to control a power supply to the apparatus; and a display unit operatively coupled to the microprocessor indicating the executed test program and associated results.

2. An apparatus according to claim 1 wherein the interface is configured for operative coupling to a drive interface of the disc drive.

3. An apparatus according to claim 1 wherein the power control mechansim further comprises a relay which is configured to control a power supply to the disc drive.

4. An apparatus according to claim 3 wherein the relay is configured to power up the disc drive as the power supply is provided to the apparatus.

5. An apparatus according to claim 1 wherein the input device comprises a jumper block.

6. An apparatus according to claim 1 wherein the input device comprises a jumper switch.

7. An apparatus according to claim 1 wherein the display unit consists essentially of a plurality of light emitting diodes operatively connected to the microprocessor.

8. A portable apparatus for testing a disc drive, the apparatus comprising:

a microprocessor having a memory for storing a plurality of test programs; and means for executing one or more of the test programs on the disc drive automatically in response only to a preselected circuit input setting.

* * * * *